(12) United States Patent
Berg

(10) Patent No.: US 6,599,583 B1
(45) Date of Patent: Jul. 29, 2003

(54) METHOD FOR MAKING SEGEMENTED THROUGH HOLES IN PRINTED CIRCUIT BOARDS

(76) Inventor: N. Edward Berg, 70 Horizon Dr., Bedford, NH (US) 03110, .

(*) Notice: Subject to any disclaimer, the term of this patent is extended or adjusted under 35 U.S.C. 154(b) by 0 days.

(21) Appl. No.: 09/937,585
(22) PCT Filed: Mar. 28, 2000
(86) PCT No.: PCT/US00/08130
§ 371 (c)(1),
(2), (4) Date: Sep. 27, 2001
(87) PCT Pub. No.: WO00/59000
PCT Pub. Date: Oct. 5, 2000

Related U.S. Application Data
(60) Provisional application No. 60/126,678, filed on Mar. 29, 1999.

(51) Int. Cl.⁷ .............................. B05D 1/06; B05D 5/12
(52) U.S. Cl. .................. 427/469; 427/97; 427/130; 427/304; 427/547; 427/550; 427/598
(58) Field of Search .................. 427/97, 469, 547, 427/550, 598, 130, 304

(56) References Cited

U.S. PATENT DOCUMENTS

| 3,873,756 A | 3/1975 | Gall et al. ............. 174/68.5 |
| 4,544,577 A | * 10/1985 | May ........................ 427/97 |
| 4,830,880 A | 5/1989 | Okubi et al. ............. 427/229 |
| 5,208,068 A | * 5/1993 | Davis et al. ............. 427/97 |
| 5,389,408 A | 2/1995 | DeVolk .................... 427/559 |

* cited by examiner

Primary Examiner—Brian K. Talbot
(74) Attorney, Agent, or Firm—Hayes Soloway P.C.

(57) ABSTRACT

A method for forming segmented through holes in a printed circuit board. The segmented through holes comprise a plurality of electrically conductive pathways disposed on the walls of a single through hole. The segmented through hole can be disposed in a two sided circuit board assembly or in a composite, multi layer circuit board assembly.

10 Claims, 8 Drawing Sheets

METHOD FOR SEGEMENTED THROUGH HOLES IN PRINTED CIRCUIT BOARDS

This application is a provisional of application Ser. No. 60/126,678, filed Mar. 29, 1999.

The invention relates to a method to form a plurality of conductive pathways inside a through hole disposed on a printed circuit board.

Referring to FIG. 1, multilayer circuit substrate 10 is formed from individual substrates 12, 14, and 16 which are separated by insulating layers 18 and 20. Interlayer interconnections on printed circuit board patterns are made by via holes when the holes are in the same substrate. For example, via hole 60 in substrate 12 connects the circuitry on surface 22 with circuitry on surface 24. Connections between conductive patterned layers on different substrates are made by through (the layers) holes. A single through hole can make connections between a number of patterns on different layers. Plated through hole 40 electrically connects conductor 42 on surface 22 with conductor 44 on surface 26, conductor 46 on surface 26, and conductor 48 on surface 32.

In order to insulate circuitry on surfaces 28 and 30 from through hole 40, guard bands 50 and 52 are disposed around plated through hole 40 on surfaces 28 and 30, respectively. These guard bands allow for the imperfect positioning and mis-alignment of the hole relative to the conducting patterns on surfaces 28 and 30. Guard bands 50 and 52 are formed from a dielectric material. Referring to FIG. 2, a top view of substrate surface 60 shows a plurality of conductors 64 each of which are electrically insulated from surface 60 by a plurality of guard bands 62.

Using prior art technology, multiple sets of inter-layer interconnections require multiple through holes. These multiple through holes and the associated guard bands can require a large amount of space on a crowded circuit board. However, for high resolution (high density) printed wiring boards the through holes must be small. For a high density board the spacing and the hole sizes become very small.

The present invention comprises a method for making segmented through holes in a printed circuit board. A mixture of a printing ink and magnetic particles is applied to the walls of a through hole disposed in a multilayer circuit board. The circuit board is then subjected to an energy field to form the ink into a segmented pattern on the walls of the through hole.

When using a conductive ink, the segmented pattern formed on the walls of the through hole comprises a plurality of electrically conductive pathways. When using a plating resist ink, the patterned through hole is then plated to form a plurality of electrically conductive pathways. When using an etch resist ink, the through hole is plated prior to application of, and segmentation of, the ink/magnetic particle mixture. After forming the segmented pattern on the walls of the through hole, the through hole is then etched to form a plurality of electrically conductive pathways.

Figure 1:
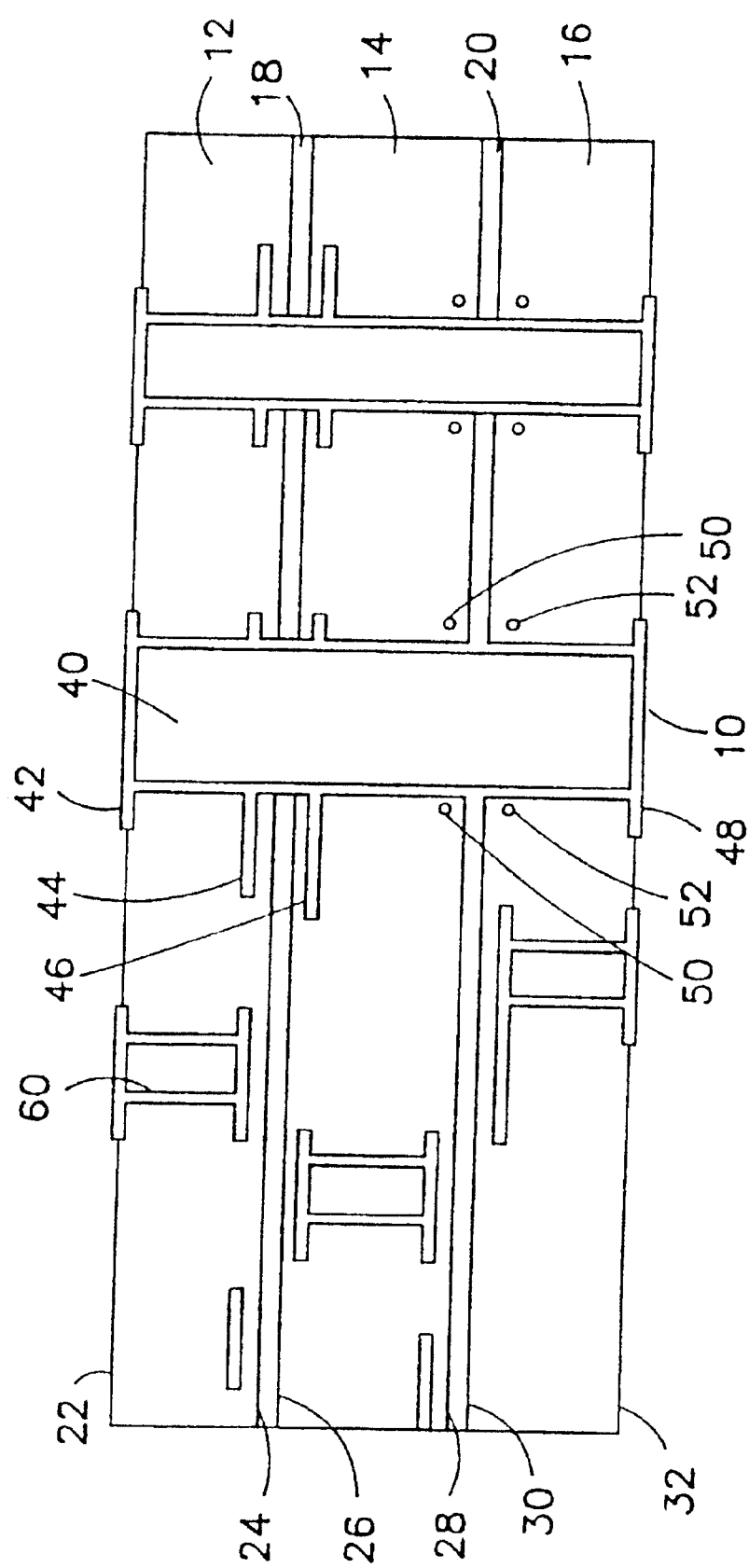
FIG. 1 is a cross-sectional view of the interlayer interconnections of a printed circuit board of the prior art.
Figure 2:
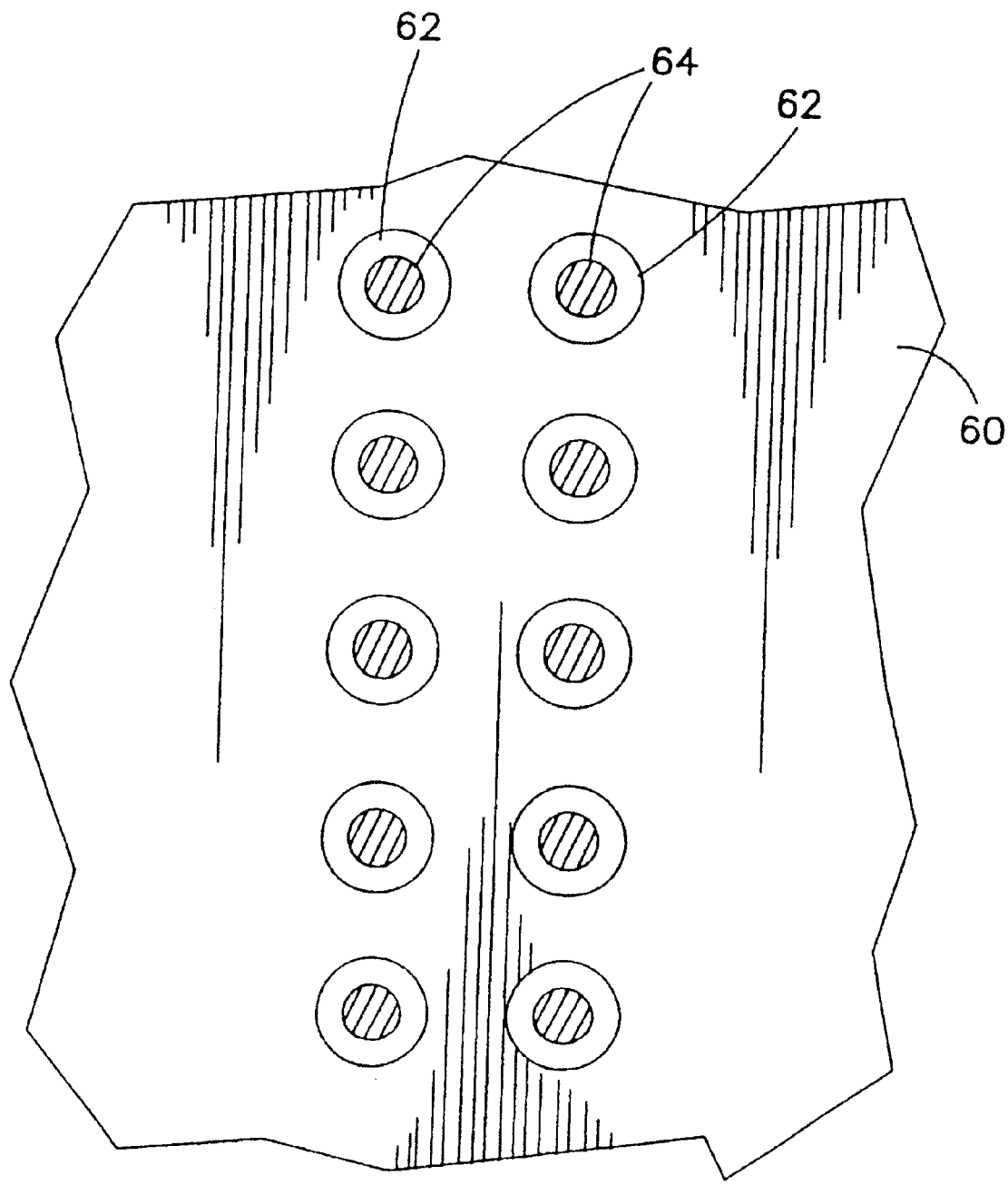
FIG. 2 is a top view showing insulating dielectric materials of the prior art.
Figure 3:
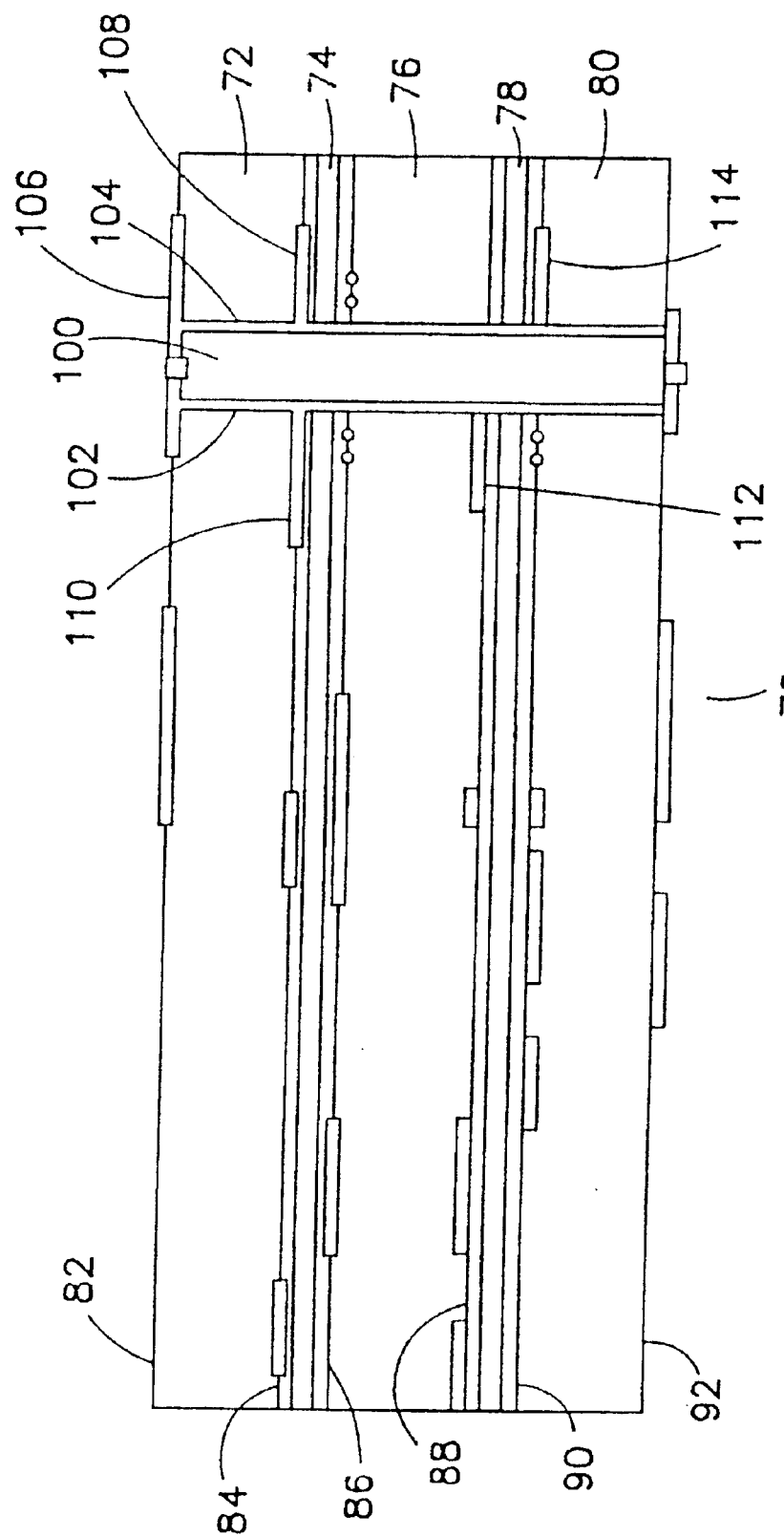
FIG. 3 is a cross-sectional view of a interlayer printed circuit board including the segmented plated through holes of the present invention.
Figure 4:
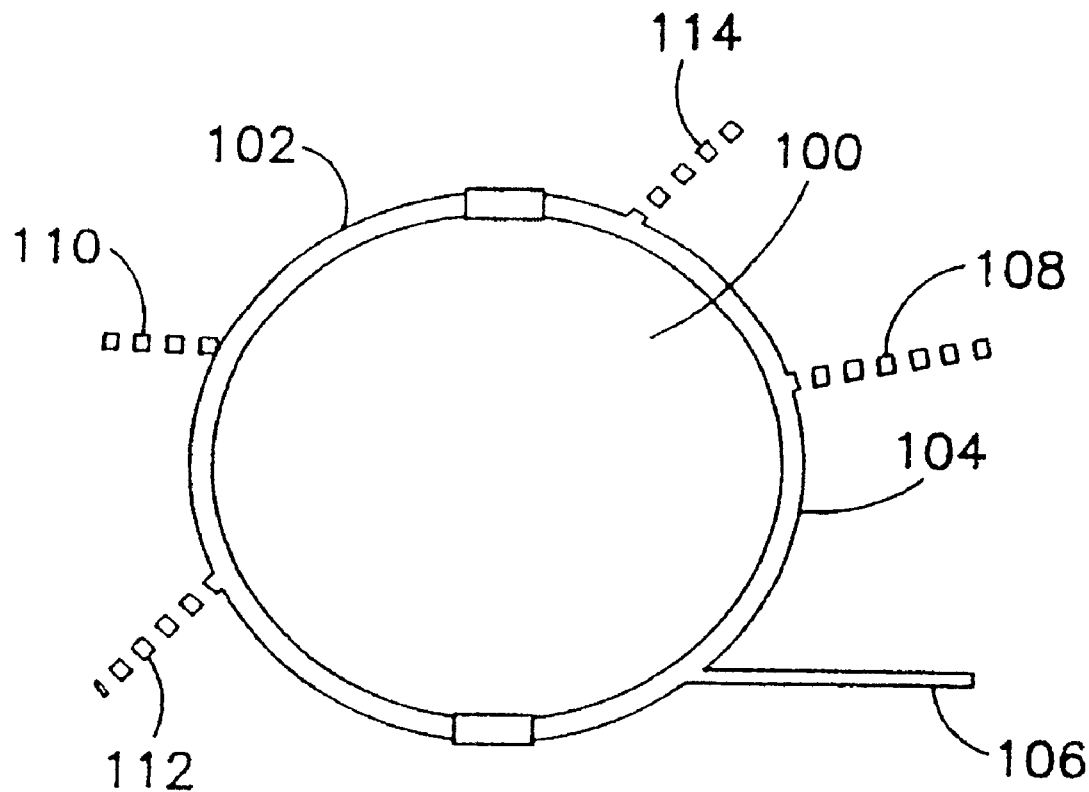
FIG. 4 is a top view of a segmented through hole according to the present invention.

Referring to FIGS. 3 and 4, composite circuit substrate 70 is formed from individual substrates 72, 76, and 80, which are separated by insulating layers 74 and 78. Through hole 100 is disposed in composite 100 such that it passes through layers 72, 74, 76, 78, and 80.

Unlike prior art devices, however, through hole 100 is segmented into two different conductive pathways, namely pathway 102 and pathway 104. Pathway 102 electrically connects conductor 110 disposed on surface 84 to conductor 112 disposed on surface 88. Pathway 104 electrically connects conductor 104 disposed on surface 82 with conductor 108 disposed on surface 84 and conductor 114 disposed on surface 90.

A segmented through hole is made by mixing an ink with magnetic particles and printing that mixture into the through hole. The inks used include etch resist inks, plating resist inks, and conductive inks. The ink/magnetic particle mixture is subjected to magnetic fields which align the mixture to form the desired segmented patterns. Conductive inks used include silver, gold, and graphite. The magnetic particles used include particles formed of iron, nickel, and cobalt. These particles are essentially spherical, having diameters between about 0.2 microns and about 5 microns. The magnetic particles are present in the ink/particle mixture in the range of about 2 weight percent and about 30 weight percent.

Figure 5:
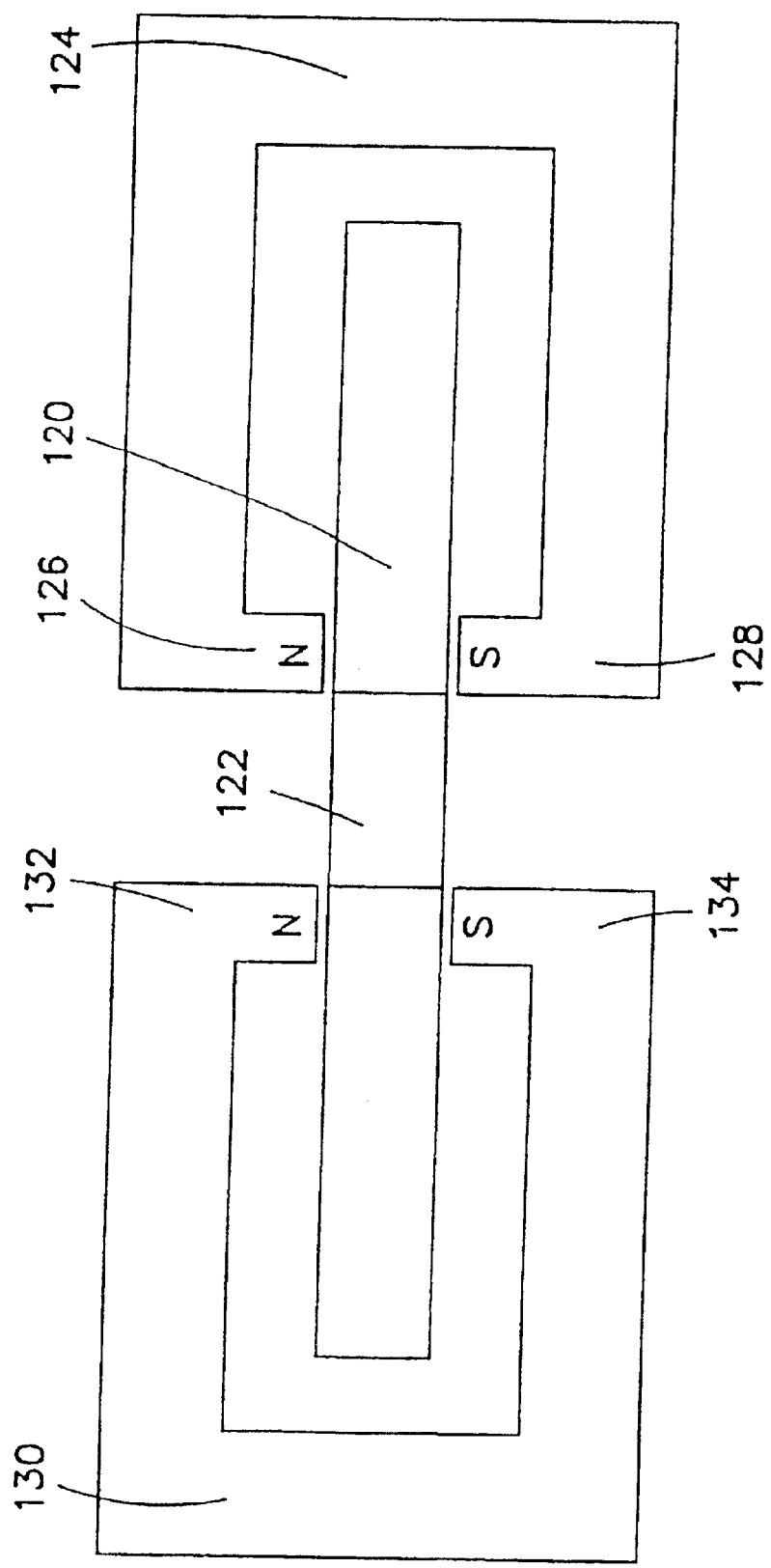
FIG. 5 is a cross sectional view showing use of two magnets for forming a two segmented through hole according to the present invention.
Figure 6:
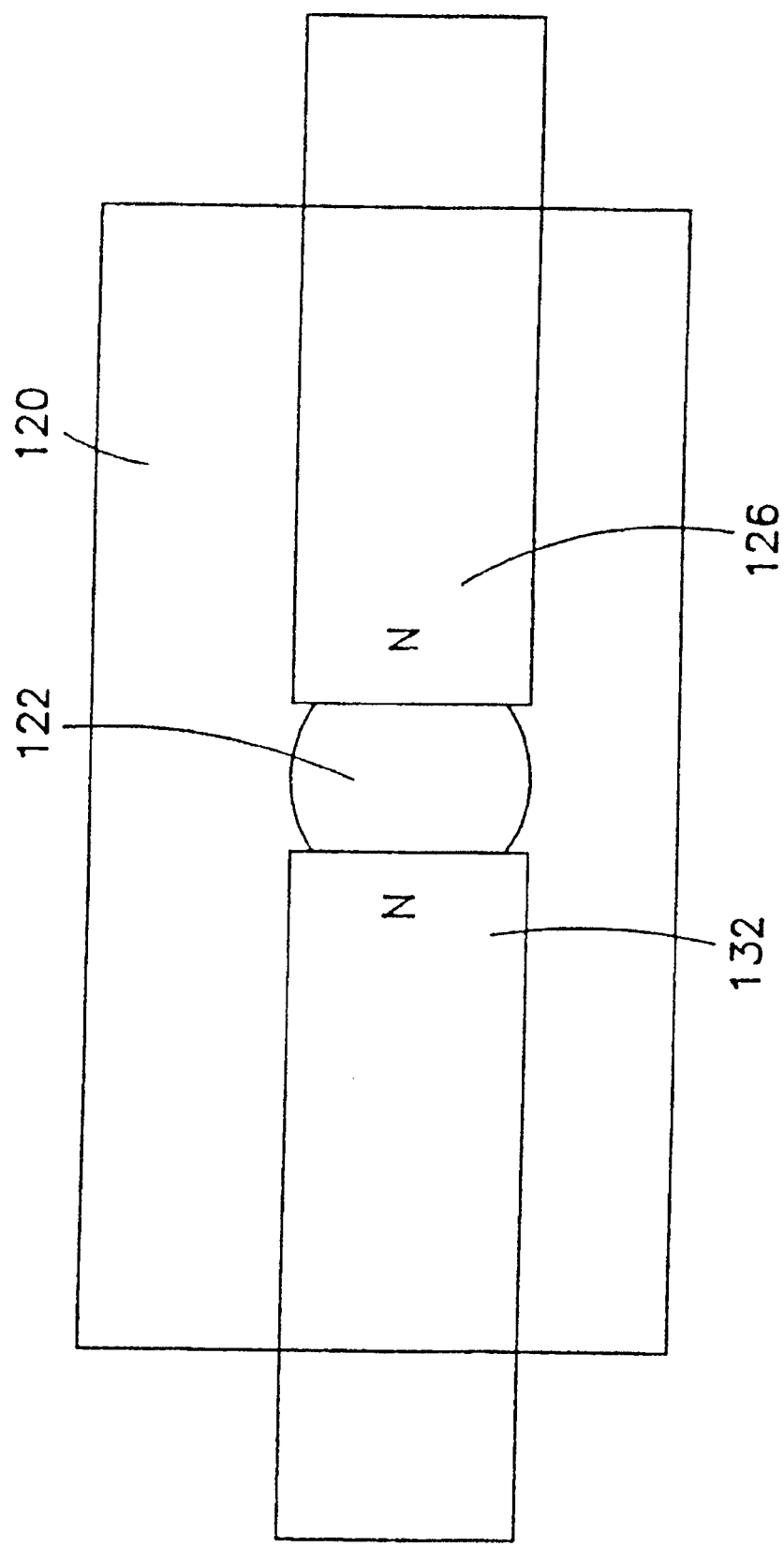
FIG. 6 is a top view showing use of two magnets to form a two segmented through hole according to the present invention.
Figure 7:
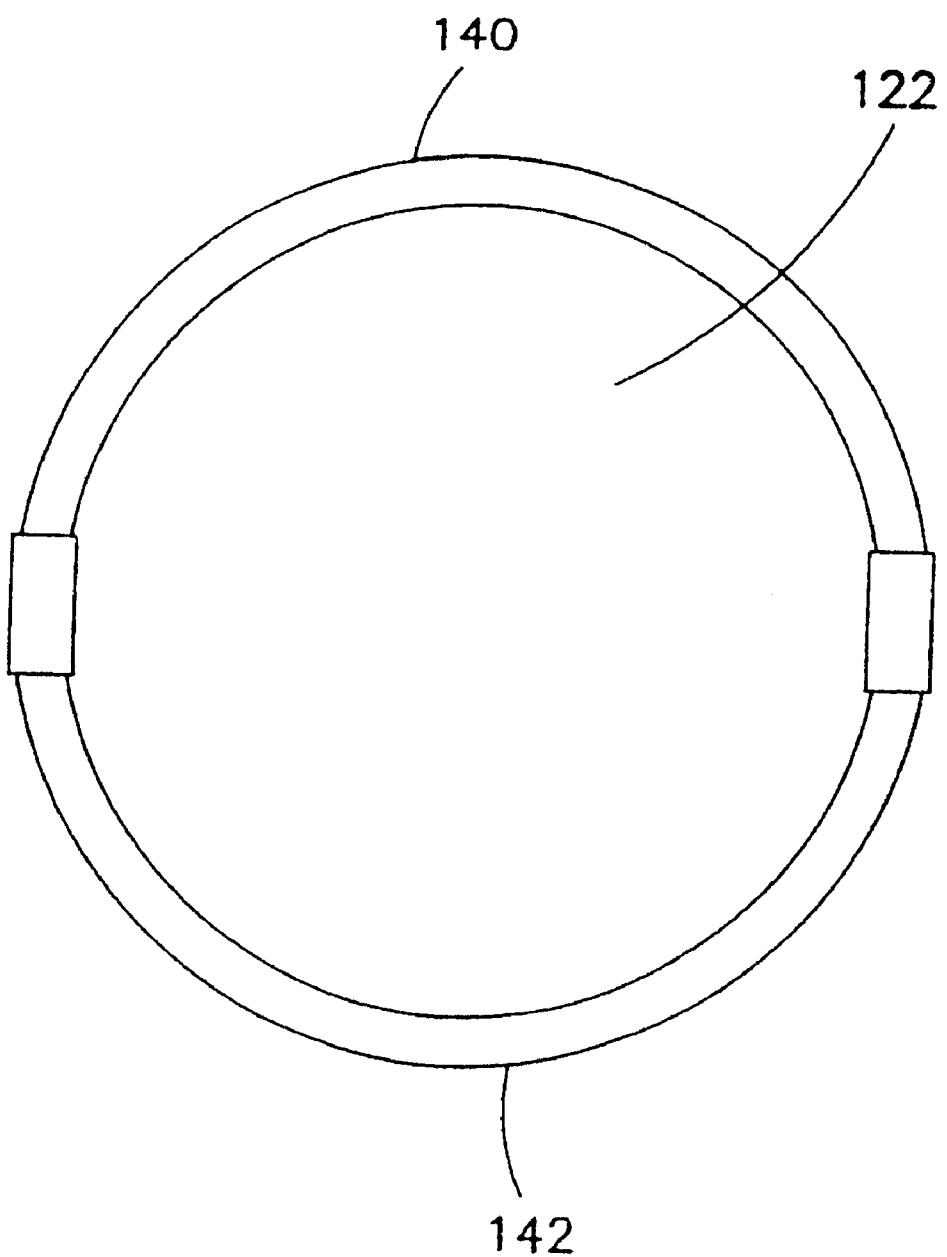
FIG. 7 is a top view of a two segmented through hole.

Referring to FIGS. 5 and 6, the mixture of a conductive ink and magnetic particles is printed into through hole 122. First magnet 124 is aligned such that first pole 126 is placed in near proximity to a first side of circuit board 120 and second pole 128 is placed in near proximity to the second side of board 120. Second magnet 130 is aligned such that first pole 132 is placed in near proximity to a first side of circuit board 120 and second pole 134 is placed in near proximity to the second side of board 120. First magnet 124 may be a permanent magnet or an electromagnet. Second magnet 130 may be a permanent magnet or an electromagnet. First magnet 124 and second magnet 130 may be formed from materials having the same magnetic permeability or from materials having different magnetic permeabilities. The magnetic fields used may be continuous or pulsed. Referring to FIG. 7, using a conductive ink/magnetic particle mixture, and patterning that mixture on the walls of through hole 122 using first magnet 124 and second magnet 130 as described above produces a segmented through hole having first conductive pathway 140 and second conductive pathway 142.

Figure 8:
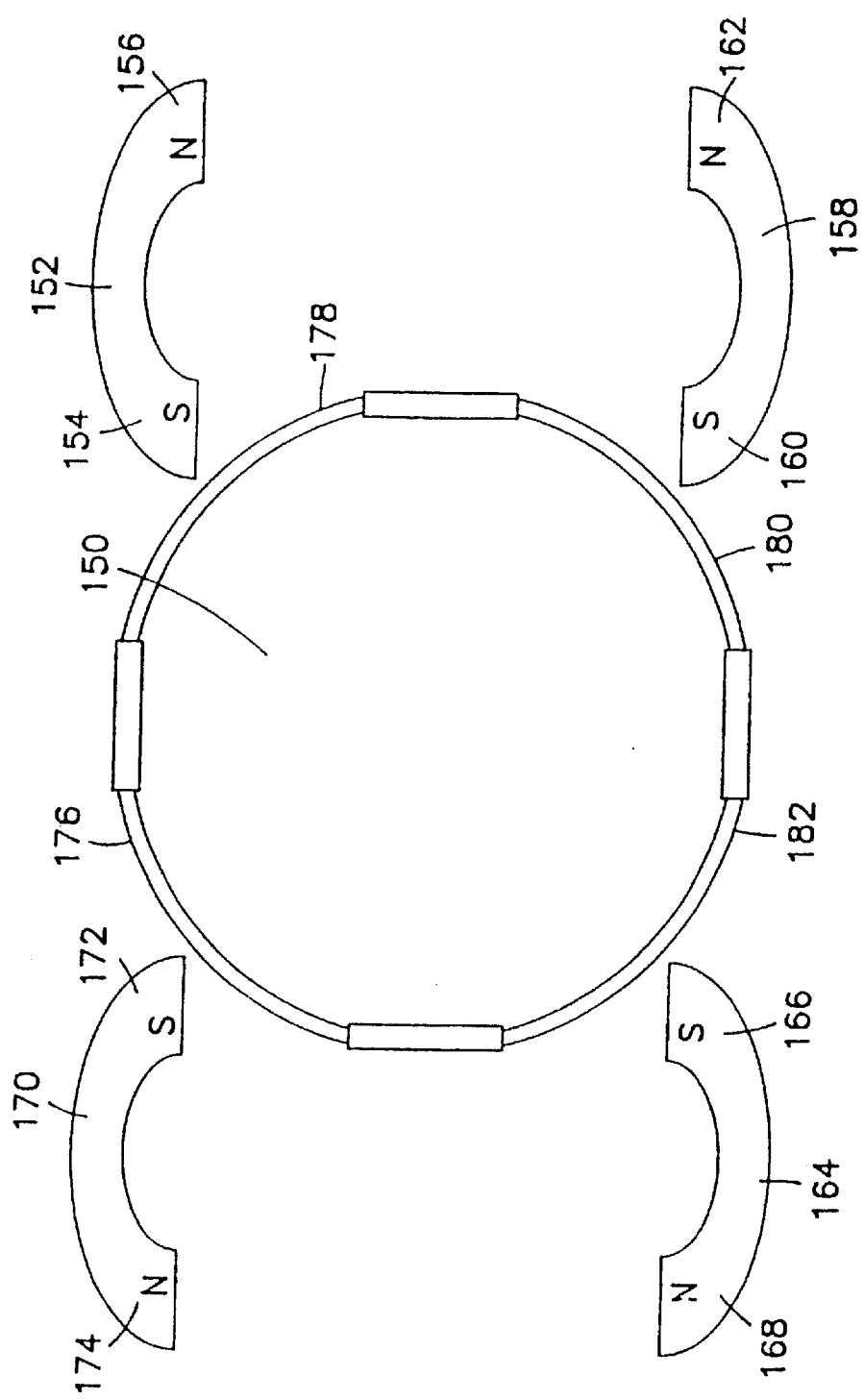
FIG. 8 is a perspective view showing use of four magnets to form four conductive pathways inside a through hole according to the instant invention.

Referring to FIG. 8, the mixture of conductive ink and magnetic particles described above can be printed into through hole 150. Magnets 152, 158, 164, and 170 are then aligned such that their respective first poles 154, 160, 166, and 172 are spaced evenly around the circumference of hole 150 on a first side of a circuit board (not shown). The second poles of magnets 152, 158, 164, and 170 may be similarly disposed around hole 150 on the second side of the circuit board. Magnets 152, 158, 164, and 170 partition the ink/magnetic particle mixture to form four separate conductive pathways, namely pathways 176, 178, 180 and 182.

First magnet 152 may be a permanent magnet or an electromagnet. Second magnet 158 may be a permanent magnet or an electromagnet. Third magnet 164 may be a permanent magnet or an electromagnet. Fourth magnet 170 may be a permanent magnet or an electromagnet. First magnet 152, second magnet 158, third magnet 164, and fourth magnet 170 may be formed from materials having the same magnetic permeability or from materials having differing magnetic permeabilities. The magnetic fields used may be continuous or pulsed.

In a separate embodiment, the ink used comprises a plating resist ink. This plating resist ink is first mixed with magnetic particles to form an ink/particle mixture, and printed inside a through hole. Plating resist inks used include acrylates, vinyl and styrenics. The magnetic particles used include particles formed of iron, nickel, and cobalt. These magnetic particles are essentially spherical, having diameters between about 0.2 microns and about 5 microns. The magnetic particles are present in the ink/particle mixture in the range of about 2 weight percent and about 30 weight percent.

The ink/particle mixture is segmented using the method described above. The segmented through hole is then plated using either an electroless method or an electroplating method. During the plating process, metal will not adhere to the segments of the through hole bearing the plating resist ink. Thus, the plating process forms a plurality of conductive pathways within the through hole. After the plating is completed, the plating resist ink can be removed from the partially plated through hole.

In another embodiment, the ink used comprises an etch resist ink. This etch resist ink is first mixed with magnetic particles to form an ink/particle mixture, and that mixture is printed inside a plated through hole. Etch resist inks used include acrylates, vinyls and styrenics. The magnetic particles used include particles formed of iron, nickel and cobalt. These magnetic particles are essentially spherical, having diameters between about 0.2 microns and about 5 microns. The magnetic particles are present in the ink/particle mixture in the range of about 2 weight percent and about 30 weight percent.

In this embodiment, the through hole is first plated with an electrically conductive metal such as copper. The etch resist ink/particle mixture is printed into that plated through hole, and the mixture is segmented using the method described above. The segmented through hole is then etched using a chemical or a mechanical process. During the etching process, metal not protected by the etch resist ink is removed from the plated through hole. Thus, the etching step forms a plurality of conductive pathways disposed on the walls of the through hole. After the etching is completed, the etch resist ink can be removed from the segmented through hole.

The method of the present invention can be used to segment through holes in a multilayer circuit board. The method also can be used to form segmented vias in a two-sided circuit board. Electric fields could be used as an alternative to magnetic fields to orient appropriately doped inks. The magnetic and/or electrostatic fields used to segment the doped inks can be continuous or pulsed. By adjusting the number of magnetic and/or electrostatic fields sources used, and by adjusting the orientation of those fields, a plurality of separately conductive segments can be formed inside a through hole.

I claim:

1. A method for making a segmented through hole in a printed circuit board, comprising the steps of:

applying a mixture comprising an ink containing magnetic particles to the walls of a through hole disposed in a circuit board;

subjecting said circuit board to an energy field to form the mixture into a segmented pattern on said walls.

2. The method of claim 1, wherein said energy field is selected from the group consisting of a magnetic field, an electric field, and mixtures thereof.

3. The method of claim 2, wherein said energy field is continuous.

4. The method of claim 2, wherein said energy field is pulsed.

5. The method of claim 1, wherein said ink comprises a conductive ink, and wherein said segmented pattern comprises a plurality of conductive pathways disposed on said walls of said through hole.

6. The method of claim 1, wherein said ink comprises a plating resist ink.

7. The method of claim 6, further comprising the step of plating said walls of said through hole to form a plurality of conductive pathways on said walls of said through hole.

8. The method of claim 7, wherein said plating step comprises electroless plating.

9. The method of claim 7, wherein said plating step comprises electroplating.

10. The method of claim 1, wherein said ink comprises an etch resist ink, and wherein said walls comprise an electrically conductive metal, further comprising the steps of:

etching said segmented pattern to form a plurality of conductive pathways; and removing said ink from said plurality of conductive pathways.

* * * * *